US009515749B2

(12) United States Patent
Leung et al.

(10) Patent No.: US 9,515,749 B2
(45) Date of Patent: Dec. 6, 2016

(54) LOW NOISE AMPLIFIER MODULE WITH OUTPUT COUPLER

(71) Applicant: QUALCOMM Incorporated, San Diego, CA (US)

(72) Inventors: Lai Kan Leung, San Marcos, CA (US); Kevin Hsi Huai Wang, San Diego, CA (US); Dongling Pan, San Diego, CA (US); Chiewcharn Narathong, Laguna Niguel, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/706,917

(22) Filed: May 7, 2015

(65) Prior Publication Data

US 2016/0329976 A1 Nov. 10, 2016

(51) Int. Cl.
| | |
|---|---|
| H04B 1/16 | (2006.01) |
| H04B 17/21 | (2015.01) |
| H04W 24/02 | (2009.01) |
| H03F 1/02 | (2006.01) |
| H03F 3/19 | (2006.01) |
| H03F 3/21 | (2006.01) |

(52) U.S. Cl.
CPC ............ *H04B 17/21* (2015.01); *H03F 1/0205* (2013.01); *H03F 3/19* (2013.01); *H03F 3/211* (2013.01); *H04W 24/02* (2013.01); *H03F 2200/294* (2013.01); *H03F 2200/451* (2013.01); *H03F 2203/21106* (2013.01)

(58) Field of Classification Search
CPC ...................................................... H04B 17/21

USPC .......................................................... 455/341
See application file for complete search history.

(56) References Cited

U.S. PATENT DOCUMENTS

| | | | |
|---|---|---|---|
| 7,081,791 B2 | 7/2006 | Carpineto et al. | |
| 8,774,745 B2 | 7/2014 | Leung et al. | |
| 2013/0316669 A1 | 11/2013 | Davierwalla et al. | |
| 2013/0316670 A1* | 11/2013 | Tasic ........................ | H03G 3/20 455/234.1 |

(Continued)

FOREIGN PATENT DOCUMENTS

EP          1505726 A1    2/2005

OTHER PUBLICATIONS

International Search Report and Written Opinion—PCT/US2016/026679—ISA/EPO—Jun. 30, 2016 (150938WO).

(Continued)

*Primary Examiner* — Sanh Phu
(74) *Attorney, Agent, or Firm* — Paradice and Li LLP (57) ABSTRACT

An amplifier module with an output coupler is disclosed. The amplifier module may include a plurality of input terminals and two or more output terminals. Each input terminal may be coupled to an input of an independent amplifier. Outputs from the independent amplifiers may be coupled to the two or more output terminals. The amplifier module may include an output coupler to couple the two or more output terminals together. A signal may be received by a first output terminal and be coupled by the output coupler to a second output terminal. In some embodiments, when the two or more output terminals are coupled together, the independent amplifiers may be made inactive or operated in a minimum gain configuration.

20 Claims, 8 Drawing Sheets

(56) References Cited

U.S. PATENT DOCUMENTS

| | | | |
|---|---|---|---|
| 2014/0098906 A1* | 4/2014 | Gudem | H04B 1/0483 375/297 |
| 2014/0113578 A1 | 4/2014 | Xu et al. | |
| 2014/0171001 A1 | 6/2014 | Fernando et al. | |
| 2014/0253242 A1 | 9/2014 | Youssef et al. | |
| 2015/0035600 A1 | 2/2015 | Jin et al. | |

OTHER PUBLICATIONS

Lai, C.M., et al., "Compact router transceiver architecture for carrier aggregation systems", Microwave Conference (EUMC), 2011 41ST European, IEEE, Oct. 10, 2011 (Oct. 10, 2011), pp. 693-696, XP032072825, ISBN: 978-1-61284-235-6 the whole document.

* cited by examiner

LOW NOISE AMPLIFIER MODULE WITH OUTPUT COUPLER

TECHNICAL FIELD

The exemplary embodiments relate generally to amplifiers, and specifically to a configurable low noise amplifier module with an output coupler.

BACKGROUND OF RELATED ART

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to generate a modulated RF signal, amplify the modulated RF signal to generate a transmit RF signal having the proper output power level, and transmit the transmit RF signal via an antenna to another device such as, for example, a base station. For data reception, the receiver may obtain a received RF signal via the antenna and may amplify and process the received RF signal to recover data sent by the other device.

The wireless device may operate within multiple frequency bands. For example, the wireless device may transmit and/or receive an RF signal within a first frequency band and/or within a second frequency band. To support multiple frequency bands and/or diversity operation, the wireless device may include a plurality of transceivers. Each transceiver may include an independent transmitter and receiver that may be tuned to operate within different frequency bands through independent local oscillators.

Calibration of the receivers may require one or more calibration signals with characteristics (e.g., frequencies) similar to local oscillator frequencies of one or more nearby receivers. Implementing signal generators to generate the calibration signals may increase a die size (and therefore the cost) of an associated integrated circuit and introduce complex calibration signal circuit routing to the receiver design.

Thus, there is a need for a low cost, die efficient approach to provide calibration signals to calibrate the receivers of a wireless device.

BRIEF DESCRIPTION OF THE DRAWINGS

The present embodiments are illustrated by way of example and are not intended to be limited by the figures of the accompanying drawings. Like numbers reference like elements throughout the drawings and specification.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scope all embodiments defined by the appended claims.

In addition, the detailed description set forth below in connection with the appended drawings is intended as a description of exemplary embodiments of the present disclosure and is not intended to represent the only embodiments in which the present disclosure may be practiced. The term "exemplary" used throughout this description means "serving as an example, instance, or illustration," and should not necessarily be construed as preferred or advantageous over other embodiments.

Figure 1:
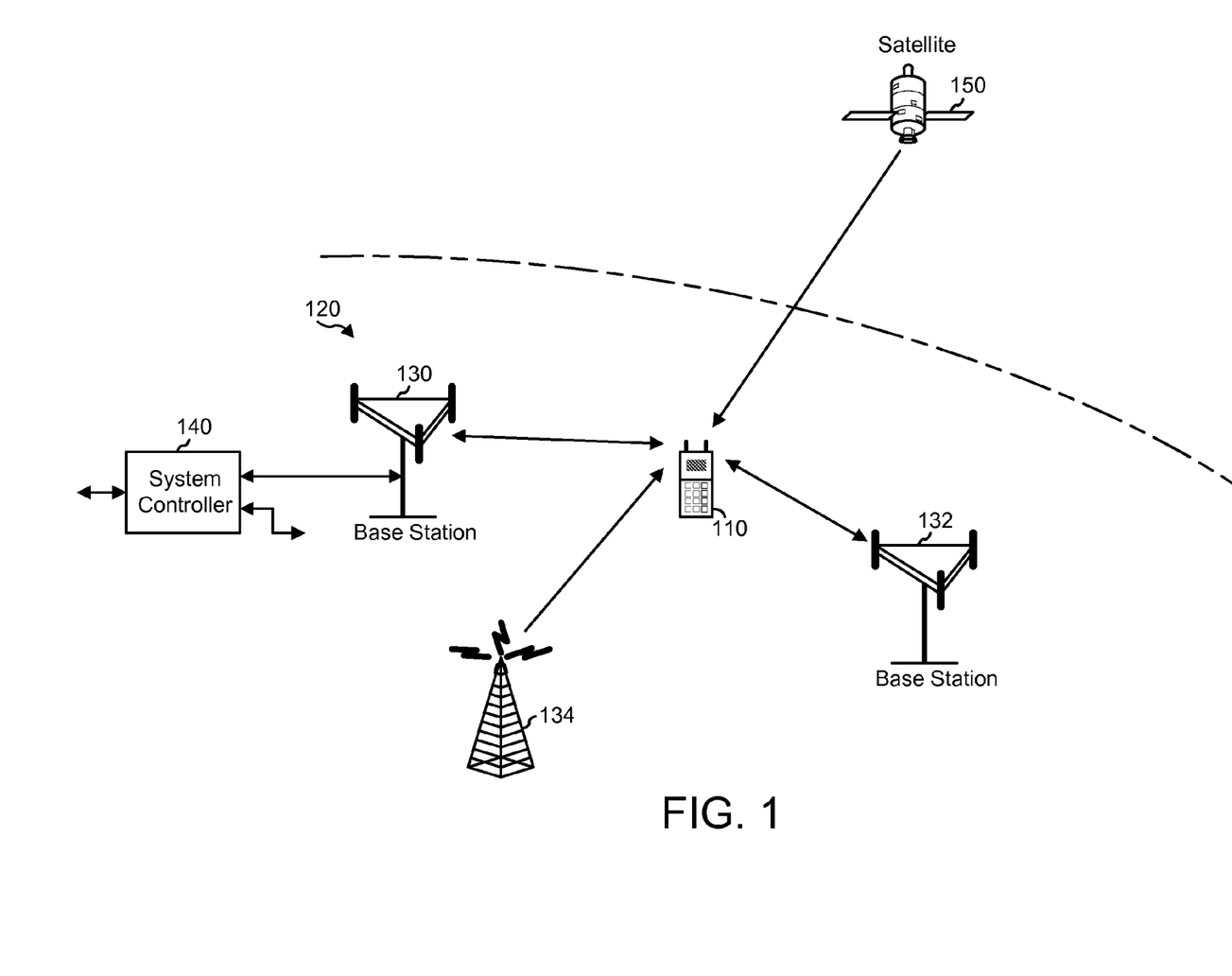
FIG. 1 shows a wireless device communicating with a wireless communication system, in accordance with some exemplary embodiments.

FIG. 1 shows a wireless device 110 communicating with a wireless communication system 120, in accordance with some exemplary embodiments. Wireless communication system 120 may be a Long Term Evolution (LTE) system, an LTE Advanced (LTE-A) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1 X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, LTE-A, WCDMA, CDMA 1X, EVDO, TD-SCDMA, GSM, 802.11, etc.

Figure 2:
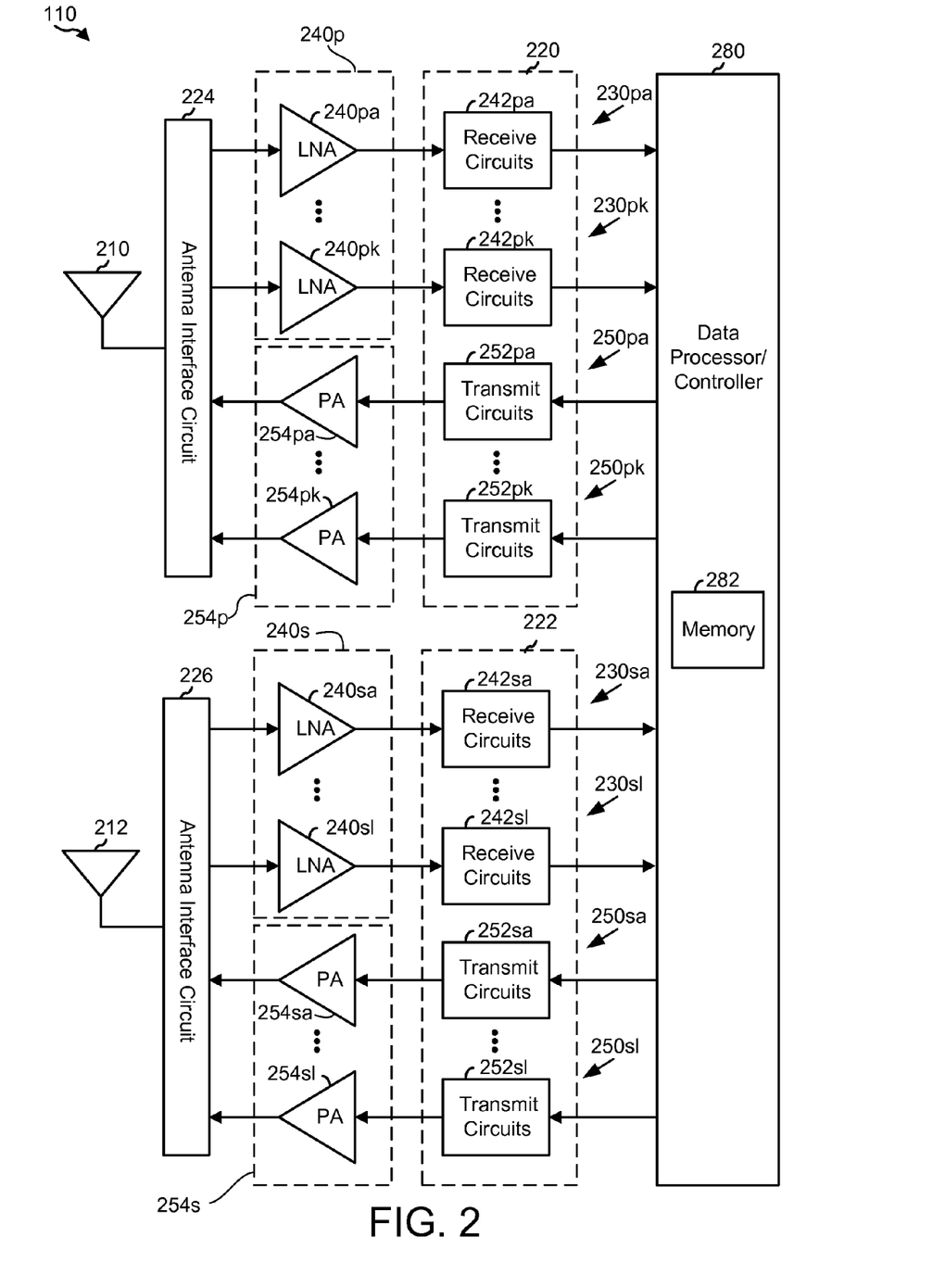
FIG. 2 shows a block diagram of an exemplary design of the wireless device of FIG. 1.

FIG. 2 shows a block diagram of an exemplary design of wireless device 110 in FIG. 1. In this exemplary design, wireless device 110 includes a primary transceiver 220 coupled to a primary antenna 210, a secondary transceiver 222 coupled to a secondary antenna 212, and a data processor/controller 280. Primary transceiver 220 includes a number (K) of primary receivers 230pa to 230pk and a number (K) of primary transmitters 250pa to 250pk to support multiple frequency bands, multiple radio technologies, carrier aggregation, etc. Secondary transceiver 222 includes a number (L) of secondary receivers 230sa to 230sl and a number (L) of secondary transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, primary receivers 230pa to 230pk may be coupled to a primary low noise amplifier (LNA) module 240p and primary receive circuits 242pa to 242pk. Primary LNA module 240p may include LNAs 240pa to 240pk. For data reception, primary antenna 210 receives signals from base stations and/or other transmitter stations and provides a received radio frequency (RF) signal, which is routed through an antenna interface circuit 224 and presented as an input RF signal to a selected receiver. Antenna interface circuit 224 may include switches, duplexers, transmit filters, receive filters, matching circuits, etc. The description below assumes that primary receiver 230pa is the selected receiver. Within primary receiver 230pa, LNA 240pa amplifies the input RF signal and provides an output RF signal. Primary receive circuits 242pa downconvert the output RF signal from RF to baseband, amplify and filter the downconverted signal, and provide an analog input signal to data processor/controller 280. Primary receive circuits 242pa may include mixers, filters, amplifiers, matching circuits, an oscillator, a local oscillator (LO) generator, a phase locked loop (PLL), etc. Each remaining primary receiver 230pb to 230pk and secondary receivers 230sa to 230sl in primary transceiver 220 and secondary transceiver 222 may operate in similar manner as primary receiver 230pa.

In the exemplary design shown in FIG. 2, each primary transmitter 250pa to 250pk includes primary transmit circuits 252pa to 252pk and is coupled to a primary power amplifier module (PA) 254p. Primary PA module 254p may include primary power amplifiers 254pa to 254pl. For data transmission, data processor/controller 280 processes (e.g., encodes and modulates) data to be transmitted and provides an analog output signal to a selected transmitter. The description below assumes that primary transmitter 250pa is the selected transmitter. Within primary transmitter 250pa, primary transmit circuits 252pa amplify, filter, and upconvert the analog output signal from baseband to RF and provide a modulated RF signal. Primary transmit circuits 252pa may include amplifiers, filters, mixers, matching circuits, an oscillator, an LO generator, a PLL, etc. A primary PA 254pa receives and amplifies the modulated RF signal and provides a transmit RF signal having the proper output power level. The transmit RF signal is routed through antenna interface circuit 224 and transmitted via primary antenna 210. Each remaining primary transmitter 250pb to 250p1 in primary transceiver 220 and secondary transmitters 250sa to 250sl in second transceiver 222 may operate in similar manner as transmitter 250pa.

Each primary and secondary receiver 230 and primary and secondary transmitter 250 may also include other circuits not shown in FIG. 2, such as filters, matching circuits, etc. All or a portion of primary transceiver 220 and secondary transceiver 222 may be implemented on one or more analog integrated circuits (ICs), RF ICs (RFICs), mixed-signal ICs, etc. For example, LNAs 240 and receive circuits 242 within transceivers 220 and 222 may be implemented on multiple IC chips, as described below. The circuits in transceivers 220 and 222 may also be implemented in other manners. In some embodiments, primary and secondary receiver 230 may support carrier aggregation and may receive two or more concurrent signals with different carrier frequencies.

Data processor/controller 280 may perform various functions for wireless device 110. For example, data processor/controller 280 may perform processing for data being received via receivers 230 and data being transmitted via transmitters 250. Data processor/controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Figure 3:
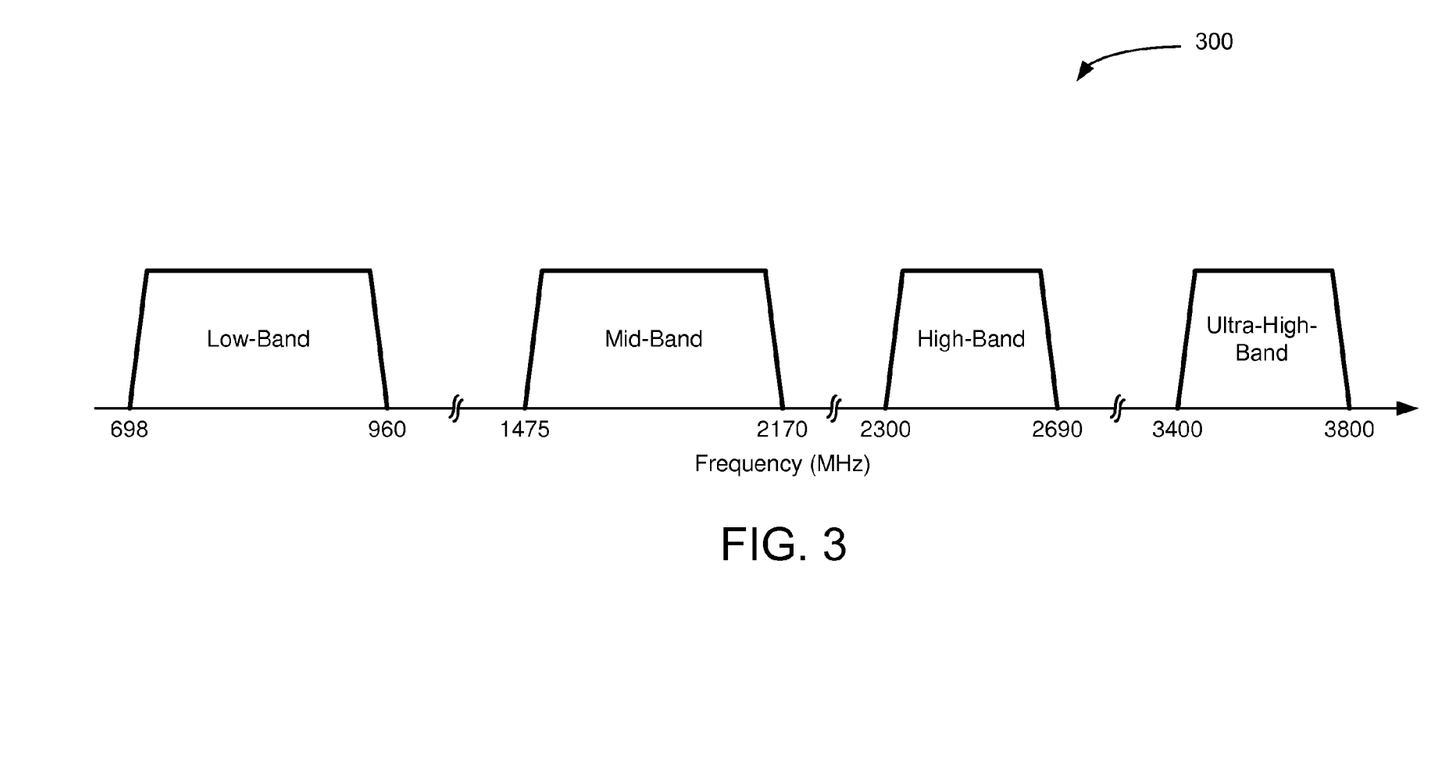
FIG. 3 is a band diagram depicting three exemplary band groups that may be supported by the wireless device of FIG. 1.

FIG. 3 is a band diagram 300 depicting three exemplary band groups that may be supported by wireless device 110. In some embodiments, wireless device 110 may operate in a low-band (LB) including RF signals having frequencies lower than 1000 megahertz (MHz), a mid-band (MB) including RF signals having frequencies from 1000 MHz to 2300 MHz, a high-band (HB) including RF signals having frequencies from 2300 MHz to 2700 MHz, and/or an ultra-high-band (UHB) including RF signals having frequencies higher than 3400 MHz. For example, low-band RF signals may cover from 698 MHz to 960 MHz, mid-band RF signals may cover from 1475 MHz to 2170 MHz, and high-band RF signals may cover from 2300 MHz to 2690 MHz and ultra-high-band RF signals may cover from 3400 MHz to 3800 MHz and 5000 MHz to 5800 MHz, as shown in FIG. 3. Low-band, mid-band, and high-band, and ultra-high band refer to four groups of bands (or band groups), with each band group including a number of frequency bands (or simply, "bands"). LTE Release 11 supports 35 bands, which are referred to as LTE/UMTS bands and are listed in 3GPP TS 36.101.

In general, any number of band groups may be defined. Each band group may cover any range of frequencies, which may or may not match any of the frequency ranges shown in FIG. 3. Each band group may also include any number of bands.

Figure 4:
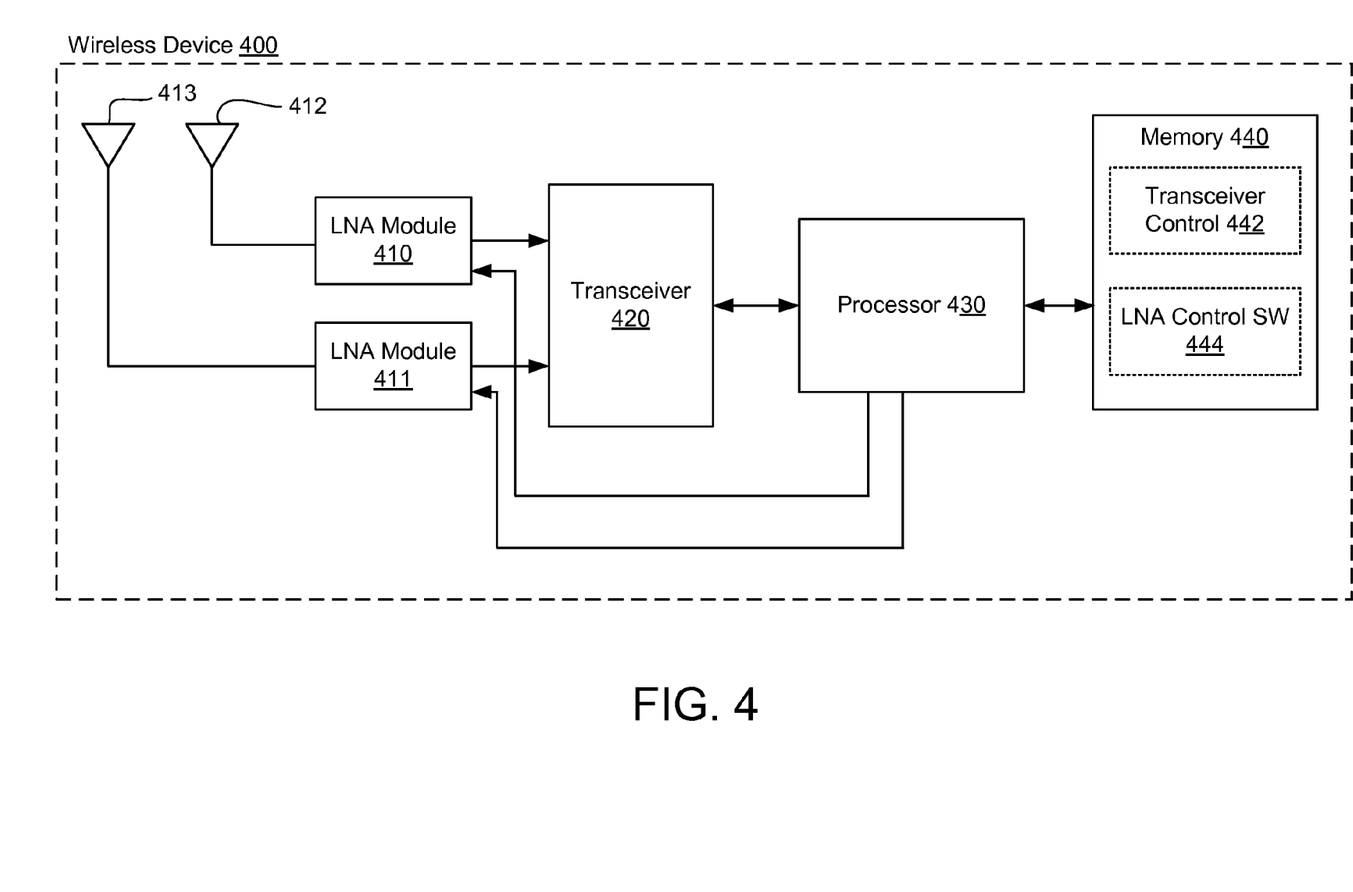
FIG. 4 shows a wireless device that is another embodiment of the wireless device of FIG. 2.

FIG. 4 shows a wireless device 400 that is another embodiment of the wireless device 110 of FIG. 2. Wireless device 400 includes a first antenna 412, a second antenna 413, a first LNA module 410, a second LNA module 411, a transceiver 420, a processor 430, and a memory 440. First LNA module 410 may be another embodiment of LNA module 240p or LNA module 500. In a similar manner, second LNA module 411 may be another embodiment of LNA module 240s or LNA module 500. First antenna 412 may be another embodiment of primary antenna 210, and second antenna 413 may be another embodiment of secondary antenna 212. In some embodiments, transceiver 420 may include transmitters to transmit communication signals and receivers to receive communication signals from other wireless devices. Additionally, first LNA module 410 and second LNA module 411 may receive communication signals through first antenna 412 and second antenna 413, respectively. Although only two antennas and two LNA modules are shown in FIG. 4, other embodiments may include other numbers of antennas and/or LNA modules.

Memory 440 may include a non-transitory computer-readable storage medium (e.g., one or more nonvolatile memory elements, such as EPROM, EEPROM, Flash memory, a hard drive, etc.) that may store the following software modules:

transceiver control module 442 to control transceiver 420 to transmit and receive communication signals in accordance with one or more communication protocols; and LNA control software module 444 to control first LNA module 410 and/or second LNA module 411.

Each software module includes program instructions that, when executed by processor 430, may cause wireless device 400 to perform the corresponding function(s). Thus, the non-transitory computer-readable storage medium of memory 440 may include instructions for performing all or a portion of the operations of FIG. 7.

Processor 430, which is coupled to transceiver 420, first LNA module 410, second LNA module 411, and memory 440, may be any one or more suitable processors capable of executing scripts or instructions of one or more software programs stored in wireless device 400 (e.g., within memory 440).

Processor 430 may execute transceiver control module 442 to configure transceiver 420 to receive and/or transmit communication signals in accordance with a communication protocol. In some embodiments, transceiver control module 442 may determine an operating frequency (e.g., carrier frequency and/or local oscillator frequency) for transceiver 420. Transceiver control module 442 may control one or more local oscillators within transceiver 420 that may be used to generate a calibration signal. Transceiver control module 442 may also calibrate one or more receivers within transceiver 420 by analyzing an output signal of the receiver and modifying one or more settings associated with the receiver, based on a received calibration signal.

Processor 430 may execute LNA control software module 444 to control first LNA module 410 and/or second LNA module 411. In some embodiments, LNA control software module 444 may select a normal operating mode or an output coupling operating mode for first LNA module 410 and/or second LNA module 411. For example, LNA control software module 444 may operate first LNA module 410 and/or second LNA module 411 in the output coupling operating mode to provide a calibration signal to a receiver within transceiver 420.

Figure 5:
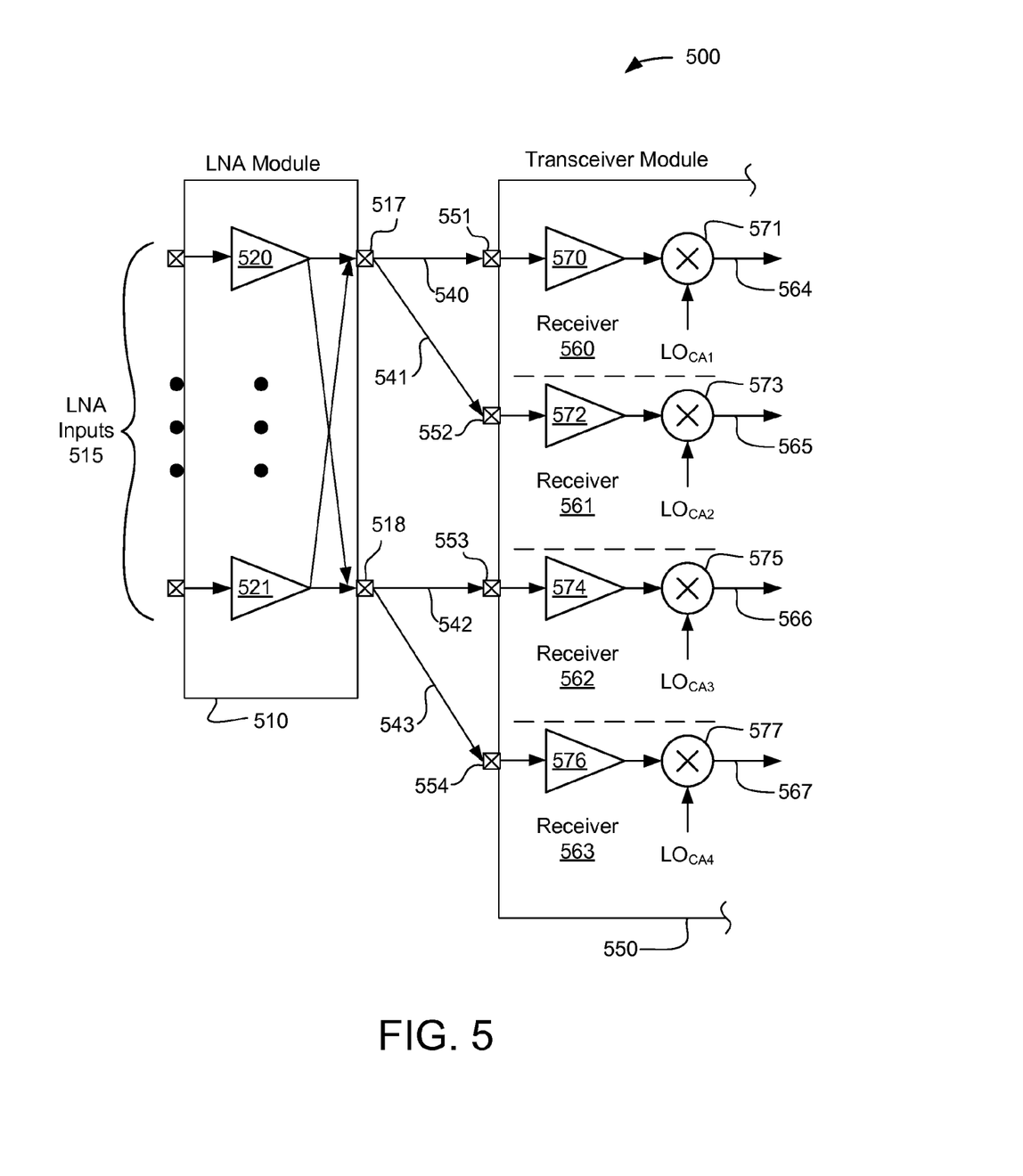
FIG. 5 is a block diagram showing an LNA module and a transceiver module of the wireless device of FIG. 1, in accordance with example embodiments.

FIG. 5 is a block diagram 500 showing an LNA module 510 and a transceiver module 550 of wireless device 110, in accordance with example embodiments. LNA module 510 may be another embodiment of primary LNA module 240p and/or secondary LNA module 240s of FIG. 2. In some embodiments, LNA module 510 may receive RF signals in different frequency bands, including LB, MB, HB and/or UHB. In a similar manner, transceiver module 550 may be another embodiment of primary transceiver 220 and/or secondary transceiver 222 of FIG. 2.

In some embodiments, LNA module 510 may include a plurality of LNA module input terminals 515, a first LNA module output terminal 517, a second LNA module output terminal 518, and a plurality of LNAs. As shown, LNA module 510 may include a first LNA 520 and a second LNA 521. In other embodiments, LNA module 510 may include more than two LNAs. Although shown as LNAs, in other embodiments, first LNA 520 and second LNA 521 may be any technically feasible amplifier. In some embodiments, each LNA within LNA module 510 may be coupled to a corresponding LNA module input terminal (e.g., a dedicated input terminal within LNA module input terminals 515).

Although only first LNA module output terminal 517 and second LNA module output terminal 518 are shown, in other embodiments, LNA module 510 may include other numbers of LNA module output terminals. In some embodiments, each LNA module output terminal may be coupled to two or more LNA outputs. For example, first LNA module output terminal 517 may be coupled to an output from first LNA 520 and an output from second LNA 521. In a similar manner, second LNA module output terminal 518 may also be coupled to the output from first LNA 520 and the output from second LNA 521. In other embodiments, outputs from each LNA may be routed to a subset of all LNA module output terminals. In some embodiments, the number of LNA module output terminals may be less than the number of LNA module input terminals. For example, LNA module may include a number M of LNA module input terminals and a number N of LNA module output terminals, where M>N.

Transceiver module 550 may include a plurality of receivers and transmitters. As shown in FIG. 5, transceiver module 550 may include a first receiver 560, a second receiver 561, a third receiver 562, and a fourth receiver 563. In other embodiments, transceiver module 550 may include other numbers of receivers. Transceiver module 550 may include one or more transmitters (not shown for simplicity). For example, each receiver within transceiver module 550 may be associated with a corresponding transmitter. Each receiver may include a buffer and a mixer. For example, first receiver 560 may include a first buffer 570 and a first mixer 571, second receiver 561 may include a second buffer 572 and a second mixer 573, third receiver 562 may include a third buffer 574 and a third mixer 575, and fourth receiver 563 may include a fourth buffer 576 and a fourth mixer 577. In other embodiments, each receiver may include different numbers of buffers, different numbers of mixers, additional components, and/or fewer components.

In some embodiments, each receiver may be associated with an input terminal to receive an input signal. For example, first receiver 560 may include a first receiver input terminal 551 coupled to first buffer 570. In a similar manner, second receiver 561 may include a second receiver input terminal 552 coupled to second buffer 572, third receiver 562 may include a third receiver input terminal 553 coupled to third buffer 574, and fourth receiver 563 may include a fourth receiver input terminal coupled to fourth buffer 576.

In some embodiments, each receiver may operate with a different local oscillator (LO) signal (e.g., a different LO frequency). For example, first receiver 560 may operate with an $LO_{CA1}$ signal, second receiver 561 may operate with an $LO_{CA2}$ signal, third receiver 562 may operate with an $LO_{CA3}$ signal, and fourth receiver 563 may operate with an $LO_{CA4}$ signal.

In some embodiments, first mixer 571 may generate a first mixer output signal 564 based on an output signal from first buffer 570 and $LO_{CA1}$. In a similar manner, second mixer 573 may generate a second mixer output signal 565 based on an output signal from second buffer 572 and $LO_{CA2}$, third mixer 575 may generate a third mixer output signal 566 based on an output signal from third buffer 574 and $LO_{CA3}$, and fourth mixer 577 may generate a fourth mixer output signal 567 based on an output signal from fourth buffer 576 and $LO_{CA4}$. Each mixer output signal may be coupled to additional components within each respective receiver (not shown for simplicity) to decode and recover data transmitted from other wireless devices.

LNA module 510 may be coupled to transceiver module 550 through a plurality of circuits to couple LNA module output terminals 517 and 518 to receiver input terminals 551-554. Circuits may be conductive traces disposed on a circuit board, wires between LNA module 510 and transceiver module 550, or any other technically feasible conductive coupling. In some embodiments, LNA module 510 and transceiver module 550 may be co-located on a common integrated circuit. Thus, in some embodiments, circuits may be conductive routes (e.g., metal layers, doped silicon, etc.), bond wires, or other on-chip conductive connection. In some embodiments, an LNA module output terminal may be coupled to two or more input terminals of transceiver module 550. For example, first LNA module output terminal 517 may be coupled to first receiver input terminal 551 via a first circuit 540 and to second receiver input terminal 552 via a second circuit 541. In a similar manner, second LNA module output terminal 518 may be coupled to third receiver input terminal 553 via a third circuit 542 and to fourth receiver input terminal 554 via a fourth circuit 543. In other embodiments, other circuit connections between LNA module 510 and transceiver module 550 may be implemented.

In some embodiments, a receiver may be calibrated to improve receiver performance. For example, first receiver 560 may be a quadrature receiver receiving an in-phase (I) input signal and a quadrature (Q) input signal through first receiver input terminal 551. First receiver 560 may include two signal processing pathways: a first processing pathway to process the in-phase input signal and a second processing pathway to process the quadrature input signal (processing pathways not shown for simplicity). If signal processing is not balanced (i.e., substantially similar) within the two signal processing pathways, an I/O mismatch may occur. The I/O mismatch may reduce an associated signal to noise ratio measurement and may also cause decoding errors associated with a received signal. In some embodiments, a receiver may be calibrated by receiving and processing a known (e.g., calibration) signal. An output of the receiver may then be examined and adjustments may be made within the two signal processing pathways to correct any signal processing imbalance.

In some embodiments, a signal provided by one receiver within transceiver module 550 may be used as a calibration signal for another receiver within transceiver module 550. Receiver input terminals 551-554 may typically receive input signals. In some embodiments, a receiver input terminal may also generate an output signal. For example, as described above, first receiver 560 may mix $LO_{CA1}$ with an input signal to generate first mixer output signal 564. While in operation, $LO_{CA1}$ may leak through first mixer 571 and buffer 570 to first receiver input terminal 551. In other words, $LO_{CA1}$ may be coupled to first receiver input terminal 551. In some embodiments, $LO_{CA1}$ may be used as a calibration signal for receivers other than first receiver 560. For example, as shown in FIG. 5, second receiver 561 may receive $LO_{CA1}$ from first receiver 560 through first circuit 540 and second circuit 541 (e.g., via LNA module output terminal 517).

Other receivers within transceiver module 550 may not be coupled via circuits to first receiver input terminal 551. For example, third receiver input terminal 553 and fourth receiver input terminal 554, while coupled to each other, may not be coupled to first receiver input terminal 551. Thus, third receiver 562 and fourth receiver 563 may be unable to receive $LO_{CA1}$. In some embodiments, LNA module 510 may include a configurable coupler to selectively couple two or more LNA module output terminals together. Accordingly, a signal received at a first module output terminal of LNA module 510 (e.g., a leakage signal from a receiver) may be coupled to a second module output terminal of LNA module 510. For example, this allows third receiver 562 and fourth receiver 563 to receive $LO_{CA1}$ and/or $LO_{CA2}$. The configurable coupler is described in more detail below in conjunction with FIGS. 6A and 6B.

Figure 6A:
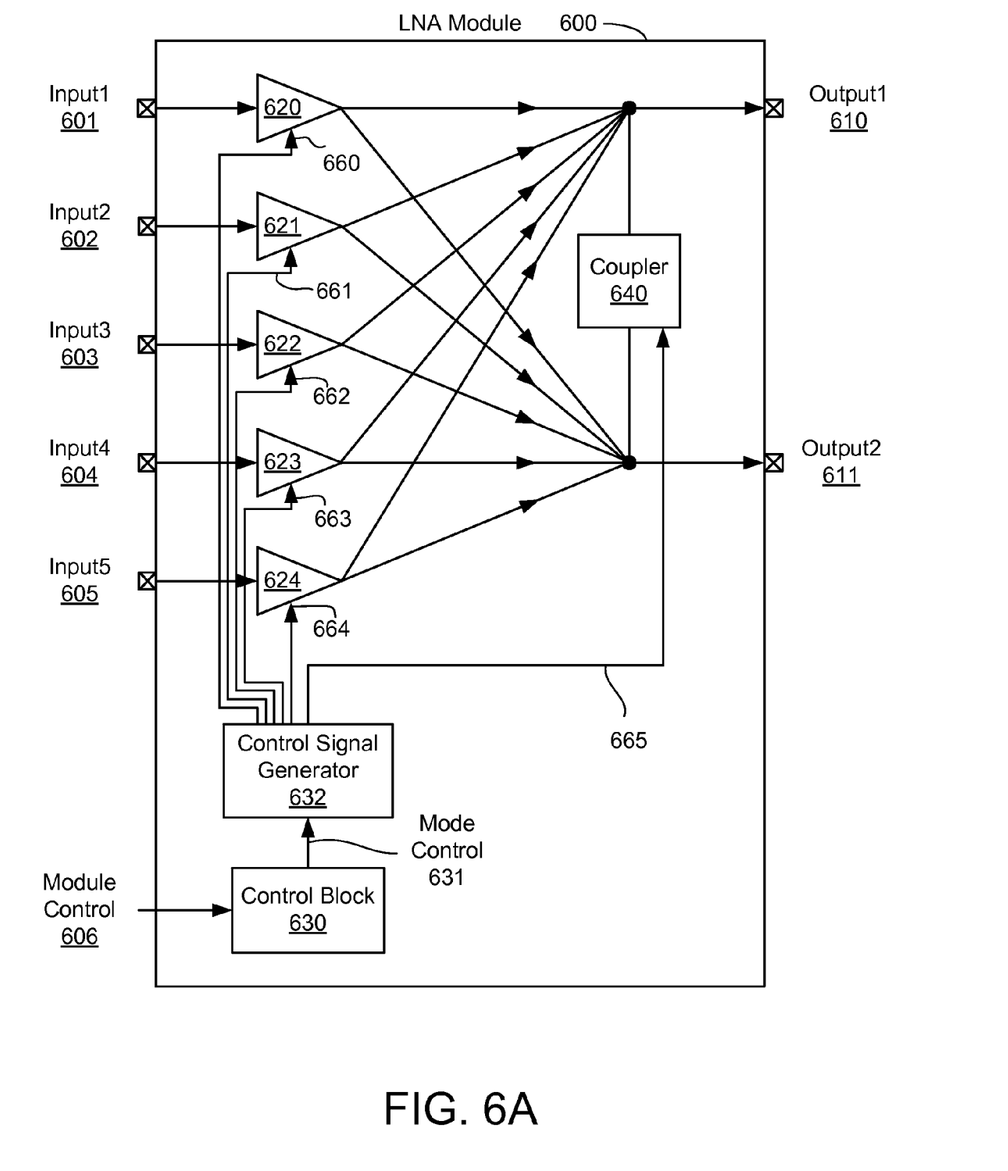
FIG. 6A is a block diagram of an LNA module, in accordance with example embodiments.

FIG. 6A is a block diagram of an LNA module 600, in accordance with example embodiments. LNA module 600 may be another embodiment of LNA module 510 of FIG. 5. LNA module 600 may include LNA module input terminals 601-605, LNA module output terminals 610 and 611, LNAs 620-624, a control signal generator 632, a control block 630, and a coupler 640. In other embodiments, other numbers of LNA module input terminals, LNA module output terminals, and LNAs may be used.

Each LNA 620-624 may be associated with one of LNA module input terminals 601-605. For example, a first LNA module input terminal 601 may be coupled to an input of a first LNA 620. In a similar manner, LNA module input terminals 602-605 may be coupled to LNAs 621-624, respectively. Outputs from LNAs 620-624 (e.g., amplifier output terminals) may be coupled together and also coupled to LNA module output terminals 610 and 611. For example, as shown in FIG. 6, an output from each of LNAs 620-624 may be coupled to a first LNA module output terminal 610 and second LNA module output terminal 611. In some embodiments, the number of LNA module output terminals may be less than the number of LNA module input terminals.

In some embodiments, LNAs 620-624 may be controlled via independent LNA control signals 660-664, respectively. For example, each LNA 620-624 may have an independent gain control and/or an independent mode control (e.g., operating mode or inactive mode) through LNA control signals 660-664.

Coupler 640 may couple two LNA module output terminals together. Although only one coupler 640 is shown within LNA module 600, in other embodiments, other numbers of coupler 640 may be used. In some embodiments, coupler 640 may enable a signal received at a first module output terminal to be output by a second module output terminal. For example, coupler 640 may enable a signal received at first LNA module output terminal 610 to be provided to second LNA module output terminal 611. In another example, coupler 640 may enable a signal received at second LNA module output terminal 611 to be provided to first LNA module output terminal 610. In some embodiments, when coupler 640 is active (e.g., coupling a first module output terminal to a second module output terminal), LNAs 620-624 may be inactive or operating in a minimum gain configuration. In still other embodiments, coupler 640 may isolate the first module output terminal from the second module output terminal.

In some embodiments, coupler 640 may be implemented with a switch unit that may include a mechanical and/or an electrical switch to couple first LNA module output terminal 610 to second LNA module output terminal 611. Exemplary electrical switches may be a relay, and/or a transistor (e.g., a bipolar transistor or a MOSFET). In other embodiments, coupler 640 may include an optional amplifier, such as a bidirectional amplifier. The bidirectional amplifier may receive and amplify signals from a first LNA output terminal and provide them to a second LNA output terminal. Coupler 640 may be controlled by a coupler control signal 665. Coupler 640 is described in more detail below in conjunction with FIG. 6B.

Control block 630 may receive a module control signal 606 and, in response thereto, drive a mode control signal 631 to a state that may cause LNA module 600 to operate in a normal operating mode or an output coupling operating mode. Module control signal 606 may be provided by data processor/controller 280, another device within wireless device 110, a separate processor, or any other technically feasible device. When LNA module 600 operates in the normal operating mode, coupler 640 may be disabled, and at least one LNA from LNAs 620-624 may be enabled to provide an LNA output signal to first LNA module output terminal 610 and/or second LNA module output terminal 611. When LNA module 600 operates in the output coupling operating mode, LNAs 620-624 may be inactive or operate in a minimum gain configuration. In addition, coupler 640 may couple and/or amplify a signal from a first LNA module output terminal to a second LNA module output terminal.

Control signal generator 632 may receive mode control signal 631 and, in response thereto, may generate one or more LNA control signals 660-664 and coupler control signal 665. In some embodiments, there may be five normal operating modes and two output coupling operating modes. For example, when LNA module 600 operates in one of the normal operating modes, control signal generator 632 may receive mode control signal 631 and assert one or more LNA control signals 660-664 to operate one of LNAs 620-624, respectively, in a normal mode of operation. Additionally, control signal generator 632 may assert coupler control signal 665 to disable coupler 640. When LNA module 600 operates in one of the output coupling operating modes, control signal generator 632 may assert LNA control signals 660-664 to cause respective LNAs 620-624 to be inactive or operate them in a minimum gain configuration. Additionally, control signal generator 632 may assert coupler control signal 665 to enable coupler 640, to determine a signal flow direction for coupler 640, and/or to determine an amount of gain that may be provided by coupler 640. Example modes and control signals are shown below in Table 1. For simplicity, table entries associated with variable gain control for coupler 640 have been omitted.

TABLE 1

| Mode | LNA control (660-664) | Coupler Control (665) |
| --- | --- | --- |
| Normal 1 | Enable LNA 620 | Disable |
| Normal 2 | Enable LNA 621 | Disable |
| Normal 3 | Enable LNA 622 | Disable |
| Normal 4 | Enable LNA 623 | Disable |
| Normal 5 | Enable LNA 624 | Disable |
| Output couple 1 | Inactive/min. gain config. | Couple LNA output 610 to LNA output 611 |
| Output couple 2 | Inactive/min. gain config. | Couple LNA output 611 to LNA output 610 |

Thus, when LNA module 600 operates in the output coupling operating mode, a signal provided by a first receiver may be used by a second receiver to perform calibration and/or testing. Dedicated test signal generators may be eliminated from the receiver design, and LO signal generators from other receivers may be used to provide a calibration and/or test signal.

Figure 6B:
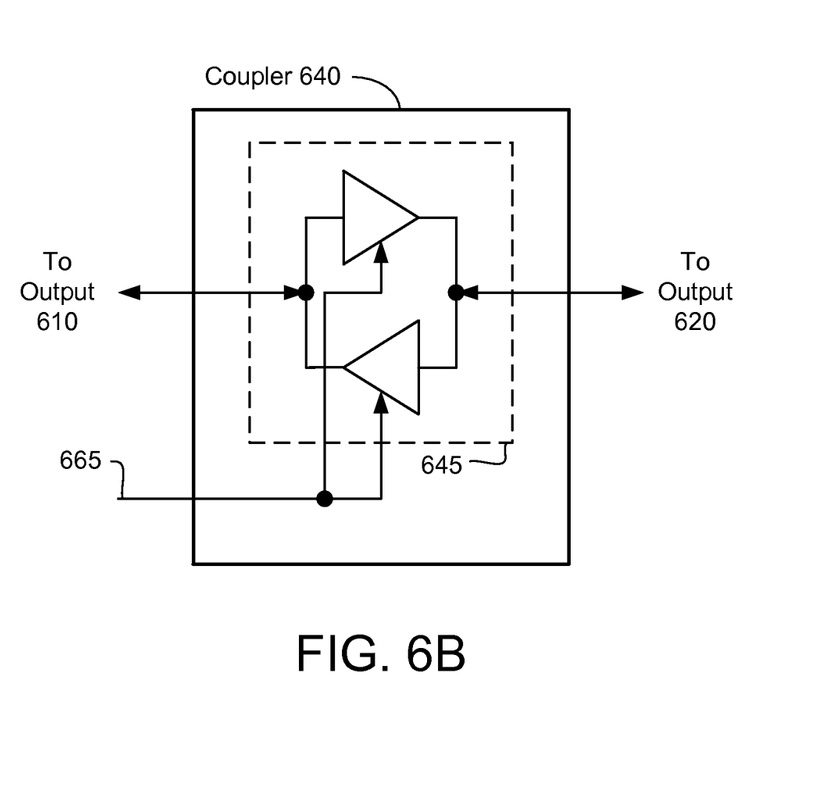
FIG. 6B is a block diagram of a coupler of FIG. 6A, in accordance with example embodiments.

FIG. 6B is a block diagram of coupler 640 of FIG. 6A, in accordance with example embodiments. Coupler 640 may include an optional bidirectional amplifier 645 (shown within dashed lines). Bidirectional amplifier 645 may couple LNA module output terminal 610 to LNA module output terminal 620.

For example, bidirectional amplifier 645 may receive an LO (leakage) signal as an amplifier input signal through LNA module output terminal 610. Bidirectional amplifier 645 may amplify the LO signal, and couple the amplified LO signal to LNA module output terminal 620. In some embodiments, bidirectional amplifier 645 may also provide selectable amounts of gain, such as between 10 to 20 dB of gain to the received signal.

In some embodiments, coupler control signal 665 may enable (make active) coupler 640, disable (make inactive and/or isolate) coupler 640, determine gain amounts of bidirectional amplifier 645, and/or determine bidirectional amplifier 645 signal flow direction (e.g., from first LNA module output terminal 610 to second LNA module output terminal 611 or from second LNA module output terminal 611 to first LNA module output terminal 610). As described above with respect to FIG. 6A, coupler control signal 665 may be driven by control signal generator 632.

Figure 7:
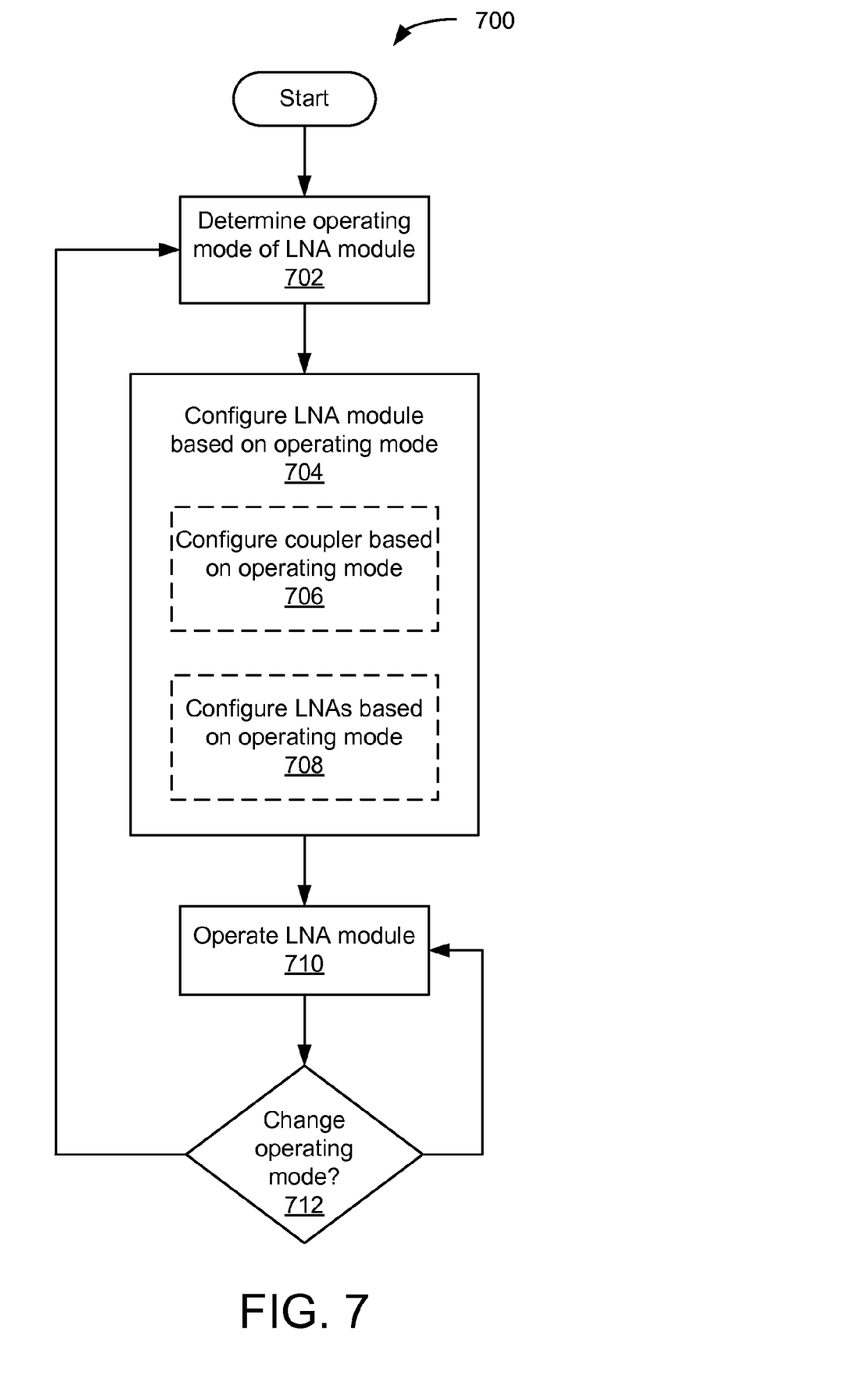
FIG. 7 shows an illustrative flow chart depicting an exemplary operation for operating an LNA module, in accordance with example embodiments.

FIG. 7 shows an illustrative flow chart depicting an exemplary operation 700 for operating LNA module 600, in accordance with example embodiments. Referring also to FIGS. 2-6B, an operating mode of LNA module 600 is determined (702). For example, LNA module 600 may be operated in an output coupling operating mode to calibrate one or more receivers (e.g., receivers 560-563) within wireless device 110. In another example, LNA module 600 may be operated in a normal operating mode to receive communication signals through one or more receivers within wireless device 110. In some embodiments, the operating mode of LNA module 600 may be determined by a module control signal 606 received by LNA module 600.

Next, LNA module 600 may be configured based on the determined operating mode (704). In some embodiments, configuration of LNA module 600 may include configuring coupler 640 based on the determined operating mode of LNA module 600 (706). For example, coupler 640 may be configured based on the operating mode of LNA module 600 as described above with respect to Table 1. In some embodiments, configuration of LNA module 600 may include configuring one or more LNAs included within LNA module 600 based on the determined operating mode of LNA module 600 (708). For example, configuration of LNAs 620-624 may be based on the operating mode of LNA module 600 as described above with respect to Table 1.

Next, LNA module 600 is operated (710). LNA module 600 may be operated based on the LNA module 600 configuration (as determined at 704). Thus, communication signals may be amplified and/or routed between LNA output terminals based on the determined operating mode of LNA module 600. In some cases, a calibration signal may be routed from a first LNA module output terminal to a second LNA module output terminal.

Next, a change of the operating mode is determined (712). If the operating mode is to change, then operations proceed to 702. If the operating mode is to remain the same, then operations proceed to 710.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media.

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An apparatus, comprising:
a plurality of amplifiers, each amplifier having an input terminal coupled to an apparatus input terminal;
a plurality of apparatus output terminals, each apparatus output terminal coupled to two or more amplifier output terminals; and
a coupler configured to amplify a first signal received at a first apparatus output terminal of the plurality of apparatus output terminals and provide the amplified first signal to a second apparatus output terminal of the plurality of apparatus output terminals.

2. The apparatus of claim 1, wherein the coupler is configured to amplify the first signal based on a first state of a mode control signal, and the coupler is configured to isolate the first apparatus output terminal from the second apparatus output terminal based on a second state of the mode control signal.

3. The apparatus of claim 1, wherein an amplifier gain provided by the coupler is based on a control signal.

4. The apparatus of claim 1, wherein the first apparatus output terminal is configured to receive the first signal and the second apparatus output terminal is configured to output the first signal.

5. The apparatus of claim 4, wherein the first signal is a calibration signal comprising a local oscillator signal generated by an adjacent receiver.

6. The apparatus of claim 1, wherein the coupler comprises a bidirectional amplifier to amplify the first signal received at the first apparatus output terminal.

7. The apparatus of claim 6, wherein the bidirectional amplifier is configured based on an operating mode of the apparatus.

8. The apparatus of claim 6, wherein the bidirectional amplifier is configured to receive an input signal from the first apparatus output terminal and provide an amplified output signal via the second apparatus output terminal based on a first state of a control signal, and wherein the bidirectional amplifier is configured to receive the input signal from the second apparatus output terminal and provide an amplified output signal via the first apparatus output terminal based on a second state of the control signal.

9. The apparatus of claim 1, wherein the coupler comprises at least one of a transistor or a switch or a combination thereof configured to couple together the first apparatus output terminal and the second apparatus output terminal.

10. The apparatus of claim 1, wherein a number of apparatus input terminals is greater than a number of apparatus output terminals.

11. The apparatus of claim 1, wherein the plurality of amplifiers are configured to be inactive based on an operating mode of the apparatus.

12. The apparatus of claim 1, wherein the plurality of amplifiers are configured in a minimum gain configuration based on an operating mode of the apparatus.

13. The apparatus of claim 1, further comprising:
a control block to generate a mode control signal based on an operating mode of the apparatus.

14. The apparatus of claim 13, wherein the control block is to:
drive the mode control signal to a first state when the apparatus is to amplify a second signal via at least one of the plurality of amplifiers; and
drive the mode control signal to a second state when the first signal is to be amplified from the first apparatus output terminal to the second apparatus output terminal.

15. An apparatus comprising:
means for amplifying signals received through apparatus input terminals via a plurality of amplifiers;
means for coupling a plurality of amplifier output terminals to each of a plurality of apparatus output terminals; and
means for amplifying a signal received at a first apparatus output terminal of the plurality of apparatus output terminals and providing the amplified signal to a second apparatus output terminal of the plurality of apparatus output terminals.

16. The apparatus of claim 15, wherein the means for coupling a plurality of amplifier output terminals is to couple three or more amplifier outputs to each of the plurality of apparatus output terminals.

17. The apparatus of claim 15, further comprising:
means for generating a mode control signal based on an operating mode of the apparatus wherein the mode control signal is to control, at least in part, the means for amplifying the signal.

18. A method for coupling output terminals of a low noise amplifier module, comprising:
receiving a signal at a first output terminal of a plurality of output terminals of the low noise amplifier module; and
configuring a coupler to amplify the signal received at the first output terminal of the low noise amplifier module and provide the amplified signal to a second output terminal of the plurality of output terminals of the low noise amplifier module based on an operating mode.

19. The method of claim 18, wherein the receiving comprises receiving the signal from a receiver coupled to the low noise amplifier module.

20. The apparatus of claim 1, wherein the first signal is received from a source other than the plurality of amplifiers.

* * * * *